July 14, 1964 H. VALDMAN ETAL 3,140,527

MANUFACTURE OF SEMICONDUCTOR ELEMENTS

Filed Dec. 7, 1959

INVENTORS
Henri VALDMAN and
Rene M. GICQUEL
By
A.A. SAFFITZ
ATTORNEY

United States Patent Office 3,140,527

Patented July 14, 1964

3,140,527
MANUFACTURE OF SEMICONDUCTOR ELEMENTS

Henri Valdman, 23 Rue Simart, Paris, France, and René M. Gicquel, 9 Rue de Paris, Palaiseau, France
Filed Dec. 7, 1959, Ser. No. 857,844
Claims priority, application France Dec. 9, 1958
4 Claims. (Cl. 29—25.3)

Figure 1A:
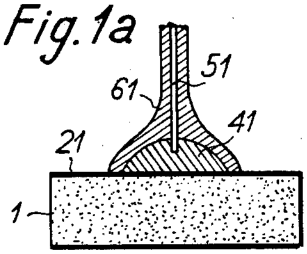
Figure 1B:
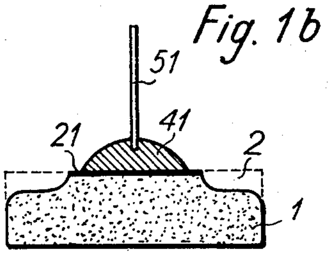
Figure 2A:
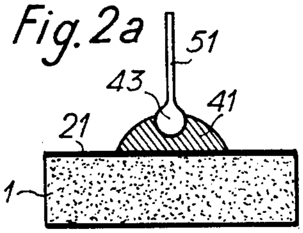
Figure 2B:
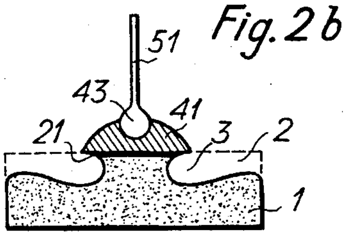
Figure 3A:
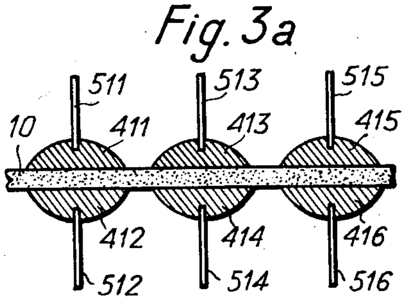
Figure 3B:
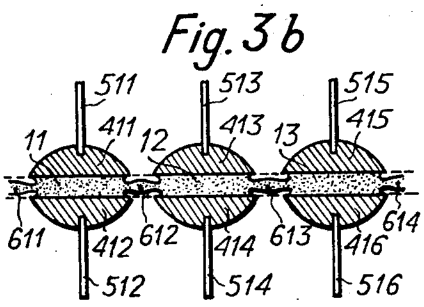
Figure 3C:
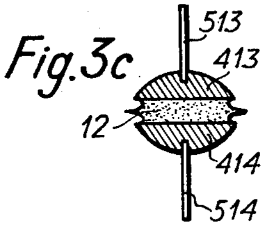
Figure 3D:
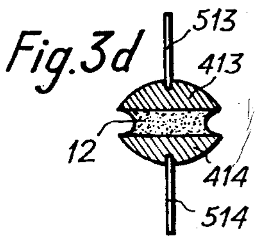

The present invention is concerned with the manufacture of semiconductor silicon elements such as diodes, transistors, multi-junction elements, etc., by an etching and a soldering process, the etching being effected by chemical solution means for dissolving the said semiconductor from a large area semiconductive silicon wafer and more particularly with the soldering of the ohmic contacts of these elements with a solder which resists the dissolving action of said chemical solution means.

It is known that to utilize semiconductor elements in electrical assemblies it is necessary to provide them with contacts having good mechanical and electrical qualities. In particular, these contacts, known as ohmic contacts, must have very small contact resistances and must not act as rectifiers.

For germanium semiconductor elements, there is no great difficulty in establishing good contacts because the standard alloys of low melting point suitably wet the surface of this semiconductor, thereby facilitating the operation of soldering.

For semiconductor elements such as silicon elements, the contact technology is more difficult. Experience shows in fact that, without special preparation, the surface of the silicon is not wetted by standard solders. Various processes are, however, known to obtain good contacts between metallic conductors and silicon semiconductor elements.

A first known process consists of forming directly an alloy between the silicon and a suitably chosen metal, such as gold or aluminium. However, the silicon is very brittle and its coefficient of expansion is very small ($4\times10^{-6}$). This may result in constraints which, during cooling after soldering, are liable to cause the rupture of the silicon-metal interface.

A second process, described in the United States Patent No. 2,763,822 of F. V. Frola et al. entitled "Silicon Semiconductor Devices," consists of interposing between an electrode of molybdenum or of tungsten or of an alloy of these two metals, and the silicon, a thin coating of solder composed of silver and of at least one element of group IVB of the periodic table. When the assembly is heated to a sufficient temperature the silver solder melts, wets the electrode and dissolves a little of the silicon which modifies its composition. After cooling, the thin intermediate layer thus constituted can ensure a contact having satisfactory electrical and mechanical characteristics between the silicon and the electrode of similar expansion coefficient. This process of manufacture, which is intended to provide power rectifiers having broad area contacts, does not allow a subsequent chemical etching as is necessary to obtain quasi-point contacts. Moreover this process is unsuitable for use in applications where it is desired to make an electrical contact to the surface of semiconductive bodies including a rectifying barrier at a very short distance from this surface, because, during the soldering process, substantial proportions of silicon dissolve in the solder material, thereby adversely affecting the electrical properties of the rectifying barrier.

When an etching step subsequent to the electrode soldering step is comprised in the manufacturing process, a third process is utilized, which consists in modifying the surface of the silicon by the deposition of an appropriate metal according to known methods (chemical deposition, deposition by evaporation, electrolytic deposition) and to use solders consisting of tin-lead alloys. This method is followed in the United States Patent No. 2,794,846 in the name of Fuller entitled "Manufacture of Semiconductor Devices," which mentions the soldering of electrodes with tin-lead solder either on the surface of the silicon which has been previously sand-blasted, copper-plated and tinned, or on a glazed coating containing metallic particles, as of platinum and significant impurities, also copper-plated and soldered, the tinned parts having to be masked with wax while the semiconductor element is soaking in an etching bath, since they are not etch-resistant.

The disadvantages of this latter process are that the limitation of the etching area is determined by the area or the extent of the drop of wax, this being necessarily larger than the area of the contact, to the detriment of its pointedness (point contact characteristics), and that the protection provided by the wax is not always sufficiently effective.

Further when the tin-lead alloys, soldered to the metal-coated silicon, are thus immersed in the usual etching baths, a corrosion of an electro-chemical nature is added to the chemical corrosion. For this reason, although the lead in a tin-lead alloy, when not soldered to metal-coated silicon is little affected by silicon-dissolving baths, the same lead, when the tin-lead alloy is soldered on to the nickeled silicon, is very rapidly attacked, because the electrochemical cell thus constituted comes into play, the lead playing the part of a soluble anode; also the products resulting from the corrosion will contaminate the surface of the silicon which is uncovered by the action of the etching fluid.

Moreover all the processes of the prior art which are described above are difficult to apply to the mass production manufacture of semiconductor elements constituted by small wafers of which the surfaces are of the order of a square millimeter, and to the etching of a surface carrying several very close point contacts, such as are found in the manufacture of transistors for high frequency alternating currents.

It is therefore desirable, in the absence of a metal or an alloy of low melting point having the same coefficient of expansion as silicon, to have available a suitable solder which is selected from the solders of sufficient plasticity to reduce the shrinking effect of cooling constraints, and to find in this selected solder an alloy which will not be rapidly destroyed by the etching bath, for which the following is an example of a standard composition:

| | Parts |
|---|---|
| Nitric acid of density 1.38 | 2 |
| Hydrofluoric acid at 40% | 1 |
| Glacial acetic acid | 1 |

The present invention provides a new ternary alloy, specifically a "gold-lead" alloy with certain specified added elements which fulfill these conditions above. The new solder alloy used in the etching process in accordance with the present invention simplifies considerably the manufacture of semiconductor devices because it allows not only silicon wafer etching without covering the wafer with wax, but also the achievement of quasi-point contacts and a cutting by chemical means of the joined elements on a single small plate of silicon for their mass production.

Experience has shown that among the ternary gold-lead alloys which have been tried, the alloys which have given satisfactory results are those of which the proportions are in the neighbourhood of those of the eutectic gold-lead alloy, which is composed of 85% lead to 15% gold (melting point: about 215° C.) and in which the third element is a member selected from the group consisting of tin, indium and gallium in an amount consisting of from 1 to 5% of the weight of the lead and gold.

These ternary alloys of the present invention have numerous advantageous features: their melting point is relatively low; they satisfactorily wet the nickel obtained by chemical reduction and also wet the gold, the copper and the low expansion Kovar alloy which is used for glass-metal bonding. Kovar is defined in the "Dictionary of Electronics" by S. Handel, Penguin Books, 1962, as an alloy of cobalt, iron and nickel which has a thermal coefficient of expansion nearly the same as a range of glass materials used in vacuum technique. It is therefore widely used in glass-to-metal seals for components such as valves and transistors.

The gold-lead alloys give metallographic structures comprising two phases, that is to say they constitute crystals of a compound having a formula $AuPb_2$, suffused in a lead matrix, which gives them a certain plasticity, reducing the above-mentioned on cooling and changing from the liquid phase to the solid phase.

Because of the presence of significant small proportions of tin, indium or gallium in the gold-lead ternary alloys these alloys remain malleable without substantially affecting the melting point. The above-mentioned elements which are added as the third component to the gold-lead alloy constitute conductivity-type determining impurities, but these third elements can be confined to the alloy and are prevented from diffusing into the silicon body by interposing a protective barrier consisting of a thin coating of nickel as will be shown hereinafter.

Satisfactory results which were obtained with an alloy of about 83%–87% lead by weight, 13%–17% gold by weight, and 1%–5% by weight of an element selected from the group consisting of tin, indium and gallium based on the total weight of said lead and gold; and the precise compositions of illustrative examples of these alloys to show the preferred mode in which the invention can be carried out have been summarized hereinbelow in Table I.

*Table I*

| No. | Lead, percent | Gold, percent | Impurities |
|---|---|---|---|
| (1) | 81 | 14 | Tin, 5%. |
| (2) | 83 | 14 | Indium, 3%. |
| (3) | 83 | 14 | Gallium, 3%. |

The two latter alloys (2) and (3) of the above table are particularly malleable and can be used in the manufacture of thin metal foils which is of some importance as will be shown hereafter.

When contacts soldered with the gold-lead alloys are immersed in an etching bath, an electrochemical phenomenon is produced similar to, but of opposite direction to, that which has been mentioned above in the case of a tin-lead alloy soldered to nickeled silicon, that is to say the semi-conductor surface is etched in a selective way in the vicinity of the solder, whereas the gold-lead alloy which, in this case, constitutes the cathode of the electrochemical cell, remains unaltered. This selective attack in the neighborhood of the solder surprisingly improves the quality of the etching.

Figure 4:
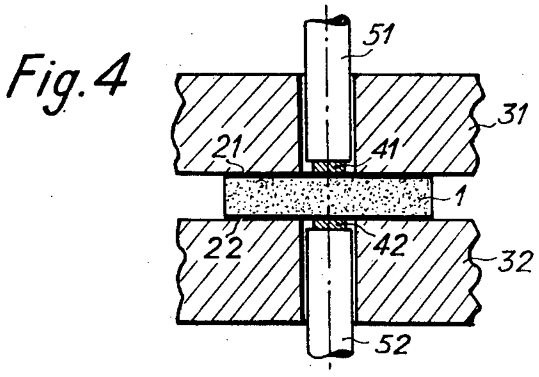

In order to show certain important aspects of the invention, there will now be described in detail the production of contacts on semiconductor elements and the separation, by chemical cutting, of semiconductor elements which have been mass produced on a single silicon plate, with reference to the attached drawings, in which:

FIGURES $1_a$ and $1_b$ represent two phases in the manufacture of a semiconductor element according to the prior art;

FIGURES $2_a$ and $2_b$ represent the same two phases of manufacture as FIGURES $1_a$ and $1_b$ but according to the process of the invention;

FIGURES $3_a$, $3_b$, $3_c$ and $3_d$ represent stages in the mass production of semiconductor elements assembled on a single silicon plate;

FIGURE 4 shows diagrammatically a mechanical assembly which can be used for the industrial production of contacts on the faces of a semiconductor element;

FIGURES $1_a$, $1_b$, $2_a$ and $2_b$ show diagrammatically the appearances of macrographs of transverse sections made in the plane of the soldered joints of contacts in the plates of silicon subjected to the usual etching baths.

FIGURES $1_a$ and $1_b$ show two phases in the manufacture of a semiconductor element immediately after the soldering of a contact obtained by means of an alloy of the prior art.

In FIGURE $1_a$ is shown a silicon plate 1 of which the upper face is covered with a thin coating 21 of nickel. A drop of standard solder, tin-lead for example, provides the mechanical and electrical contact between the nickeled surface 21 of the silicon and an electrode 51, for example of molybdenum. A covering 61 of wax ensures the protection of the solder and of the electrode during their immersion in the etching bath. After etching and removal of the wax, this assembly takes on the aspect shown in FIGURE $1_b$. The erosion produced by the etching is seen at 2. Owing to the fact that the covering of wax must extend beyond the solder in order to cover it, a ring of the nickel coating 21 exists around the drop of solder, which is contrary to what is required, as explained above, for the production of quasi-point contacts.

FIGURES $2_a$ and $2_b$ show the same two phases of manufacture as FIGURES $1_a$ and $1_b$ when the contact is produced according to the invention.

The experiments of which the results are shown in these figures, having been carried out with .1 millimeter thick gold electrodes, and this metal having a certain solubility in the molten gold-lead alloy, the end of the electrodes 51 is strengthened in the form of a ball 43 in order to avoid a weakening of the gold electrode at its point of penetration into the alloy. Further, to avoid undesirable strains, the ball 43 must be held without touching the coating 21. These arrangements are useless with the electrodes of gilded Kovar, of which the method of soldering will be explained in connection with FIGURE 4.

The contact of gold-lead solder shown in FIGURE $2_a$ is immersed in an etching bath without any protection. After etching, it assumes the appearance shown in FIGURE $2_b$. It is seen that the nickel 21 has disappeared flush with the solder and that the chemical attack on the silicon seen at 2 has been accentuated at 3 all around the base of the solder by the electrochemical attack described above, which enables an almost ideal point contact to be produced. With an etching bath of appropriate composition, for example such as that which is given above, the area etched in the vicinity of the solder of gold-lead alloy is perfectly polished. Also, it is possible to control, by the duration of the immersion in a given etching bath, the depth of the attack and in consequence the diameter of the constriction which is an important characteristic of semiconductor elements. This etching time which varies greatly with small variations in the composition of the bath is of the order of 5 to 10 minutes for the usual etching baths.

FIGURES $3_a$, $3_b$, $3_c$ and $3_d$ show, by way of example, the application of the process to the manufacture of a series of elements of a diameter of the order of .5 to 2 millimeters, provided on both faces with contacts soldered with gold-lead alloy.

The silicon plate 10 of FIGURE $3_a$ has a thickness of between 50 and 500 microns and can comprise one or several junctions. On this plate 10 several contacts such as 411, 413, 415 and 412, 414, 416, exactly measured and arranged opposite one another in pairs, have been obtained with the gold-lead alloy by means of a mechanical device formed by two similar graphite perforated plates, the holes of which are distant each other about 5 millimeters, applied on the two opposite faces of the silicon plate and arranged to have their holes opposite one another in pairs.

After the soldering step achieved, the graphite plates are removed and the silicon plate 10 provided with contacts and electrodes is immersed in an etching bath, until the individual elements constituted by a pair of contacts with electrodes and the portion of the silicon plate included between them, are separated.

FIGURE $3_b$ shows the points 611, 612, 613, 614 of initiation of cutting of the plate 10 between the solder points of the contacts after the commencement of etching.

FIGURES $3_c$ and $3_d$ show the view of one of the elements such as 413 obtained respectively immediately after the chemical and after the etching has finished.

Thus will be avoided the mechanical cutting of small semiconductor elements which, up to the present, could barely receive more than pressure contacts by reason of the difficulties of etching and manipulation.

FIGURE 4 shows a mechanical arrangement which can be used to obtain opposite contacts on the two faces of a plate 10 of silicon when using electrodes which have an expansion coefficient in the neighbourhood of that of silicon and which are resistant to attack of acid etching bath, for example gilded Kovar electrodes. Little pellets 41 and 42 having .5 to 1 millimeter of diameter are cut in very thin foils, of the order of a tenth of one millimeter of a gold-lead alloy such as defined above.

The semiconductor plate 1, silicon for example, on which contacts must be soldered, is covered, on its two faces 21 and 22, with a thin coating or nickel. It is held between two graphite plates 31 and 32 through which pass two cylindrical holes of which the common axis of revolution passes through the centre of the plate 1. The pellets 41 and 42 of gold-lead alloy are introduced through these two cylindrical holes.

The pellet 41 is supported on the metallic coating 21 and supports the end of the electrode 51 which is to be soldered on the coating 21. The electrode 51, the diameter of which is of the order of .5 to 1 millimeter, is held perpendicular to the plane of the coating 21 by the wall of the cylindrical hole formed in the graphite plate 31 and having a diameter slightly wider than the electrode 51.

In the same way, the pellet 42 is supported on the metallic coating 22 and supports the end of the electrode 52.

The production of contacts by soldering is effected by placing the assembly described above, in a furnace heated to a temperature sufficient to cause the melting of the pellets 41 and 42.

From the examples of manufacture of semiconductor elements given above, a man skilled in the art will easily understand that it is possible to extend the process of the invention to the much more complicated structures required for the current applications of semiconductors.

We claim:

1. A method of mass producing small semiconductor devices comprising the step of nickeling the two parallel faces of a silicon wafer, presenting perpendicularly to said parallel faces equally spaced apart metallic leads arranged opposite one another in pairs and resistant to attack by acid silicon dissolving baths, maintaining an alloy of about 85% lead by weight and 15% gold by weight at a temperature slightly above 215° C., soldering said metallic leads to said nickeled parallel faces with said alloy to allow discrete spots of said alloy to adhere thereto and dipping said silicon wafer into an acid silicon dissolving bath until the silicon surface portions which are exposed and are not covered by said alloy spots are dissolved.

2. A method of mass producing semiconductor devices comprising the steps of nickeling the two parallel faces of a silicon semiconductor wafer, placing etch-resistant metallic leads perpendicularly to said parallel faces, said metallic leads being equally spaced apart, being disposed opposite one another in pairs and being resistant to attack by acid silicon dissolving baths, soldering with an alloy of about 81% lead by weight, 14% gold by weight and 5% tin by weight at a temperature slightly above 215° C. to secure said leads to said nickeled parallel faces and to allow discrete spots of said alloy to adhere to said faces, and thereafter dipping said silicon wafer into an acid silicon dissolving bath until the silicon surface portions which are exposed and are not covered by said alloy spots are dissolved.

3. A method of mass producing semiconductor devices comprising the steps of nickeling the two parallel faces of a silicon semiconductor wafer, placing etch-resistant metallic leads perpendicularly to said parallel faces, said metallic leads being equally spaced apart, being disposed opposite one another in pairs and being resistant to attack by acid silicon dissolving baths, soldering with an alloy of about 83% lead by weight, 14% gold by weight and 3% indium by weight at a temperature slightly above 215° C. to secure said leads to said nickeled parallel faces and to allow discrete spots of said alloy of adhere to said faces, and thereafter dipping said silicon wafer into an acid silicon dissolving bath until the silicon surface portions which are exposed and are not covered by said alloy spots are dissolved.

4. A method of mass producing semiconductor devices comprising the steps of nickeling the two parallel faces of a silicon semiconductor wafer, placing etch-resistant metallic leads perpendicularly to said parallel faces, said metallic leads being equally spaced apart, being disposed opposite one another in pairs and being resistant to attack by acid silicon dissolving baths, soldering with an alloy of about 83% lead by weight, 14% gold by weight and 3% gallium by weight at a temperature slightly above 215° C. to secure said leads to said nickeled parallel faces and to allow discrete spots of said alloy to adhere to said faces, and thereafter dipping said silicon wafer into an acid silicon dissolving bath until the silicon surface portions which are exposed and are not covered by said alloy spots are dissolved.

References Cited in the file of this patent

UNITED STATES PATENTS

| | | |
|---|---|---|
| 2,793,420 | Johnston | May 28, 1957 |
| 2,804,581 | Lichtgarn | Aug. 27, 1957 |
| 2,813,326 | Liebowitz | Nov. 19, 1957 |
| 2,836,878 | Shepard | June 3, 1958 |
| 2,878,147 | Beale | Mar 17, 1959 |
| 2,897,587 | Schnable | Aug. 4, 1959 |
| 2,906,930 | Raithel | Sept. 29, 1959 |
| 2,917,684 | Becherer | Dec. 15, 1959 |
| 2,942,166 | Michlin | June 21, 1960 |
| 2,982,002 | Shockley | May 2, 1961 |
| 3,021,595 | Milam | Feb. 20, 1962 |
| 3,022,568 | Nelson et al. | Feb. 27, 1962 |

FOREIGN PATENTS

| | | |
|---|---|---|
| 601,547 | Canada | July 12, 1960 |

OTHER REFERENCES

Metals Handbook, 1948 ed., Cleveland, ASM, p. 1173.